(12) United States Patent
Lee et al.

(10) Patent No.: US 7,153,727 B2
(45) Date of Patent: Dec. 26, 2006

(54) SEMICONDUCTOR DEVICE AND METHOD OF MANUFACTURING THE SAME

(75) Inventors: Ju-Yong Lee, Seoul (KR); Kyu-Hyun Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 10/719,624

(22) Filed: Nov. 20, 2003

(65) Prior Publication Data

US 2004/0140486 A1 Jul. 22, 2004

(30) Foreign Application Priority Data

Jan. 17, 2003 (KR) .................. 10-2003-0003359

(51) Int. Cl.
*H01L 21/82* (2006.01)
(52) U.S. Cl. .................. 438/128; 438/239; 438/396; 438/672
(58) Field of Classification Search ............... 438/672, 438/128, 129, 239, 396, FOR. 220, FOR. 430; 257/E27.084, E21.646
See application file for complete search history.

(56) References Cited

U.S. PATENT DOCUMENTS

| | | | |
|---|---|---|---|
| 5,478,768 A | | 12/1995 | Iwasa |
| 5,780,338 A | | 7/1998 | Jeng et al. |
| 5,874,359 A | * | 2/1999 | Liaw et al. .................. 438/640 |
| 5,918,122 A | * | 6/1999 | Parekh et al. ............... 438/253 |
| 5,930,623 A | * | 7/1999 | Wu ............................ 438/253 |
| 5,966,610 A | * | 10/1999 | Wang et al. ................. 438/396 |
| 6,043,131 A | * | 3/2000 | Yu ............................. 438/396 |
| 6,121,085 A | * | 9/2000 | Liang et al. ................. 438/256 |
| 6,251,725 B1 | * | 6/2001 | Chiou et al. ................ 438/253 |
| 6,255,686 B1 | | 7/2001 | Takeuchi et al. |
| 6,277,727 B1 | * | 8/2001 | Kuo et al. ................... 438/618 |
| 6,300,213 B1 | * | 10/2001 | Dennison ..................... 438/396 |
| 6,410,423 B1 | | 6/2002 | Anezaki et al. |
| 6,458,692 B1 | | 10/2002 | Kim |

FOREIGN PATENT DOCUMENTS

DE 19610272 A1 3/1996
JP 2001-217405 10/2001

OTHER PUBLICATIONS

English Language of Japanese Abstract from Japanese Patent Publication No. JP2001-217405, published Oct. 8, 2001.
US Patent No. 6,127,734, which is an English language counterpart to German Publication No. DE 19610272.

* cited by examiner

*Primary Examiner*—Michelle Estrada
(74) *Attorney, Agent, or Firm*—Marger Johnson & McCollom, P.C.

(57) ABSTRACT

Disclosed herein are a semiconductor device and a method of manufacturing the same that increases the reliability of these devices as size design limitations decrease. Generally, a first insulating film, and wiring, including conductive film patterns and second insulating film patterns are formed on a substrate. Third insulating film patterns including a silicon-oxide-based material are formed on sidewalls of the wiring, and contact patterns and spacers on the sidewalls thereof for defining contact hole regions are formed on the wiring. The contact holes contact surfaces of the third insulating film patterns and pass through the first insulating film. Thus, the thickness of a second insulating film pattern used in the wiring can be minimized, thereby increasing a gap-fill margin between the wiring. A parasitic capacitance between the wiring can be reduced because silicon oxide spacers with a low dielectric constant are formed on sidewalls of the wiring.

5 Claims, 14 Drawing Sheets

SEMICONDUCTOR DEVICE AND METHOD OF MANUFACTURING THE SAME

CROSS REFERENCE TO RELATED APPLICATIONS

This application claims priority under 35 USC § 119 to Korean Patent Application 2003-3359, filed on Jan. 17, 2003, the contents of which are herein incorporated by reference in their entirety for all purposes.

BACKGROUND OF THE INVENTION

1. Field of the Invention

The present invention relates generally to a semiconductor device, and more particularly, to a dynamic random access memory (DRAM) device and a method of manufacturing the same.

2. Description of the Related Art

As the technology for manufacturing semiconductor devices has progressed and become more developed, because of increasing demands for products that utilize memory devices, there has been a demand to provide larger capacity memory devices. To help meet this demand, the integration density of a DRAM device whose memory cell is composed of one capacitor and one transistor has been remarkably improved.

Accordingly, as the integration density of a semiconductor device increases, a size of a contact hole connecting one element to another element or one film to another film is reduced, while a thickness of an interlayer dielectric film is augmented. Thus, an aspect ratio of the contact hole, i.e., a ratio of the diameter of the contact hole relative to the length of the contact hole, increases so that an alignment margin for forming the contact hole decreases during a photolithographic process. As a result, the formation of a minute contact hole may become very difficult through conventional methods of forming contact holes.

For DRAM devices in particular, a process for introducing a landing pad is widely used to reduce the aspect ratio of the contact hole. Also, a self-aligned contact structure is commonly employed for a pattern having a feature size of below 0.1 mm to settle a short-circuit problem caused by a reduction in the alignment margin.

FIGS. 1A to 1C are diagrams of cross-sectional views illustrating a conventional method of manufacturing a DRAM device having a self-aligned contact structure.

Referring to FIG. 1A, metal oxide semiconductor (MOS) transistors (not shown) respectively having gate electrodes and source/drain regions are formed on a semiconductor substrate 10. Each gate electrode includes a gate insulating film, a gate capping film composed of silicon nitride, and a gate sidewall spacer composed of silicon nitride.

After a first interlayer dielectric film 12, composed of silicon oxide, is formed on the substrate 10, where the MOS transistors are formed, the first interlayer dielectric film 12 is planarized by a chemical mechanical polishing (CMP) process or an etch-back process. Then, the first interlayer dielectric film 12 is etched under an etching condition having a high etching selectivity relative to silicon nitride, thereby forming contact holes 13 and exposing the source/drain regions. At this time, the contact holes 13 are self-aligned relative to the gate electrodes, respectively.

After a doped polysilicon film (not shown) is formed on the first interlayer dielectric film 12 to fill up the contact holes 13, the doped polysilicon film is etched by a CMP process or an etch-back process to form pad electrodes 14 contacting with the source/drain regions of the MOS transistors.

Next, a second interlayer dielectric film 16, composed of silicon oxides is formed on the first interlayer dielectric film 12 and the pad electrodes 14. The second interlayer dielectric film 16 has a thickness of about 1000 to about 3,000 Å. The second interlayer dielectric film 16 is planarized by a CMP process or an etch-back process. With a typical photolithographic process, the second interlayer dielectric film 16 is partially etched to form bit line contact holes (not shown) exposing the pad electrodes 14. The bit line contact holes are then filled using a conductive material to form bit line contact plugs (not shown) therein. The bit line contact plugs are connected to the pad electrodes positioned on the source/drain regions.

A conductive film (not shown), e.g., a tungsten film, is formed on the second interlayer dielectric film 16 and the bit line contact plugs. The conductive film has a thickness of about 400 to about 800 Å.

A bit line mask layer (not shown) composed of silicon nitride is the formed on the conductive film. The bit line mask layer has a relatively thick thickness of about 3000 Å. The bit line mask layer and the conductive film are successively etched by a photolithographic process to form bit lines 22 composed of bit line mask layer patterns 20 and conductive layer patterns 18. The bit lines 22 are connected to the bit line contact plugs, respectively.

Referring to FIG. 1B, after a silicon nitride film is formed on the bit lines 22 and the second interlayer dielectric film 16, the silicon nitride film is anisotropically etched to form bit line spacers 24 on sidewalls of the bit lines 22, respectively.

Referring to FIG. 1C, a third interlayer dielectric film 26, composed of boro-phosphor silicate glass (BPSG), undoped silicate glass (USG), high density plasma (HDP) oxide, or chemical vapor deposited (CVD) oxide, is formed on a surface of the resultant structure. Then, the third interlayer dielectric film 26 is planarized by a CMP process or an etch-back process.

On the third interlayer dielectric film 26, photoresist patterns (not shown) that define storage node contact hole regions are formed by a photolithographic process. At this time, each photoresist pattern has an open region that is wider than the interval between adjacent bit lines 22. Thus, the bit line mask layer pattern 20 positioned at an edge portion of the bit line 22 and the bit line spacer 24 on the sidewall of the bit line 22 are exposed.

Using the photoresist patterns as etching masks, the third interlayer dielectric film 26 and the second interlayer dielectric film 16 are selectively etched with an etching gas having a high etching selectivity relative to the bit line spacers 24, which are composed of silicon nitride. This etching process forms storage node contact holes 28 that are self-aligned to the bit lines 22. The storage node contact holes 28 expose the pad electrodes 14 between the bit lines 22, i.e., the pad electrodes 14 formed on the source regions.

After removing the photoresist patterns, storage node contact plugs (not shown), composed of a conductive material, such as doped polysilicon, are formed in the storage node contact holes 28, respectively.

According to the above-described conventional method, because the thickness of the bit line mask layer pattern 20 composed of silicon nitride should be augmented so as to ensure a margin for the self-aligned contact etching process, a height of the bit line 22 should be also increased. However, when a design rule for a pattern is reduced to below 0.1 mm, the interval between the bit lines 22 is also reduced, thereby increasing the aspect ratio of the bit line 22. Furthermore, when the third interlayer dielectric film 26 is formed on the bit lines 22 having the bit line spacers 24, the interval between the bit lines 22 may become even more narrow leading to increases in the aspect ratios of the bit lines 22. As a result, the gap between the bit lines 22 may be not completely filled with the third interlayer dielectric film 26, thereby causing voids in the third interlayer dielectric film 26.

When voids are formed in the third interlayer dielectric film 26 as described above, they can further expand during subsequent cleaning processes. Now, when the polysilicon film for the storage node contact plug is formed, polysilicon may permeate into the expanded voids creating a bridge connection between adjacent storage node contact plugs. If the thickness of the bit line mask layer is reduced to settle this problem, bit line notching may occur due to a low etching selectivity between the photoresist and the silicon nitride.

Meanwhile, when the self-aligned contact etching process is performed for forming the storage node contact holes 28, the bit line mask layer patterns 20 and the bit line spacers 24, which protect the underlying bit lines 22, are etched because of the small shoulder margins of the bit lines 22. This additional etching can generate a short-circuit between the bit line 22 and the storage node contact plug.

The bit lines are generally used with wiring to detect the existence of charges stored on the memory cells of DRAM devices, and they are also connected to sense amplifiers in a peripheral circuit region. Variations in the bit line voltage are detected by detecting the charges stored on the memory cells. These voltage variations are augmented as the storage capacitance of the memory cell increases or the bit line loading capacitance decreases. Because the decrease of the bit line loading capacitance improves the sensitivity of the sense amplifier, it is preferable to reduce this capacitance, especially when considering the additional improvements in reliability and response speed.

In the above-described conventional method, parasitic capacitance, i.e. the bit line loading capacitance between the bit line and the storage node contact plug or between the bit lines, may be increase because the bit line spacers 24, which are composed of silicon nitride having a high dielectric constants, are formed on the sidewalls of the bit lines 22 to form the self-aligned contact structure. Additionally, the bit line loading capacitance generally increases as the thickness of the bit line spacers 24 decrease. Thus, when the thickness of the bit line spacer 24 is greatly reduced in accordance with the above-mentioned principles, the bit line loading capacitance is largely increased. Though the number of the bit lines 22 positioned in the cell array region could be reduced to help solve the above-mentioned problems, the number of effective chips formed on a wafer may decrease in accordance with the decrease of the bit lines 22 in the cell array region.

U.S. Pat. No. 6,458,692 and Japanese Laid Open Patent Publication No. 2001-217405 disclose methods of forming contacts using spacers composed of silicon oxide having a low dielectric constant. The spacers are formed on the sidewalls of bit lines, thereby reducing a bit line loading capacitance. However, in the above methods, a reduction in the thickness of the bit line mask layer may limit the gap-fill margin of an interlayer dielectric film or decrease the shoulder margin of a bit line during an etching process for a self-aligned contact. As a result, an electrical short-circuit may be generated between the bit line and a storage node contact plug.

SUMMARY OF THE INVENTION

According to one embodiment of the present invention, a semiconductor device having a semiconductor substrate and a first insulating film formed on the substrate is provided. Wiring is formed on the first insulating film. Each wiring includes a conductive film pattern and a second insulating film pattern formed on the conductive layer pattern. Third insulating film patterns, which may be composed of a silicon oxide based material, are formed on sidewalls of the wiring, respectively. Contact patterns are then formed on the third insulating film patterns. The contact patterns include contact spacers formed on the sidewalls thereof so that the contact patterns define contact holes. The contact holes are aligned with surfaces of the third insulating film patterns and penetrate into the first insulating film, thereby exposing portions of the first insulating film through the contact holes.

In one aspect of the present invention, third insulating film patterns are continuously formed on surfaces and sidewalls of the wiring, and contact patterns are then formed on the third insulating film patterns positioned on the wiring. The third insulating film pattern is self-aligned relative to the contact spacers. Additionally, the contact pattern and the contact spacer include materials having etching selectivities relative to the third insulating film patterns, such as silicon nitride or polysilicon.

According to one embodiment of the present invention, after a first insulating film is formed on a semiconductor substrate, wiring, which includes conductive film patterns and second insulating film patterns formed on the conductive film patterns, are formed on the first insulating film. A third insulating film, including a silicon oxide based material, is formed on the wiring and on the first insulating film. Contact patterns that define contact holes exposing portions of the first insulating film are then formed over the wiring. Contact spacers are formed on sidewalls of the contact patterns, respectively. Using the contact patterns and the contact spacers as masks, the third insulating film and the first insulating film are etched to form contact holes. At this time, third insulating film patterns are simultaneously formed on sidewalls of the wiring, respectively. Before forming the contact patterns, a predetermined portion of the third insulating film is preferably planarized or the third insulating film is planarized until a surface of the second insulating film patterns is exposed.

In another aspect of the present invention, a DRAM device including a semiconductor substrate having capacitor contact regions and a first insulating film formed on the substrate is provided. Bit lines are formed on the first insulating film between the capacitor contact regions. The bit lines include first conductive film patterns and second insulating film patterns formed on the first conductive film patterns. Third insulating film patterns, composed of silicon oxide based materials, are formed on sidewalls of the bit lines. Contact patterns are then formed on the third insulating film patterns. The contact patterns include contact spacers formed on sidewalls thereof, thereby defining storage node contact holes. The storage node contact holes are in contact with surfaces of the third insulating film patterns and pass through the first insulating film, thereby exposing the capacitor contact regions between the bit lines.

In a method of manufacturing a DRAM device in accordance with the present invention, a first insulating film is formed on a semiconductor substrate having capacitor contact regions. Bit lines including first conductive film patterns and second insulating film patterns are formed on the first insulating film between the capacitor contact regions. A third insulating film, composed of a silicon oxide based material, is formed on the bit lines and on the first insulating film. Contact patterns for defining storage node contact holes are formed on the bit lines, exposing the capacitor contact regions between the bit lines. Next, contact spacers are formed on sidewalls of the contact patterns. Using the contact patterns and the contact spacers as masks, the third insulating film and the first insulating film are etched to form the storage node contact holes and to simultaneously form third insulating film patterns on sidewalls of the bit lines.

According to the present invention, the contact patterns and contact spacers, which are composed of materials having etching selectivities relative to the silicon oxide based materials, are formed on the wiring. Then, using the contact patterns and the contact spacers as etching masks, the insulating films composed of silicon oxide based materials are etched to form the contact holes between the wiring. Since the contact patterns and contact spacers protect the conductive film patterns of the wiring during an etching process for forming the contacts, a thickness of the second insulating film pattern of the wiring can be minimized to decrease the height of the wiring. Therefore, the aspect ratios of the wiring can be reduced to increase a gap-fill margin between the wiring.

In addition, since the contact hole between the wiring, e.g., the storage node contact hole, is not formed by a self-aligned contact etching process, a shoulder margin of the wiring can be maintained to prevent an electrical short-circuit between the wiring and the contact plug formed in the contact hole.

Additionally, a parasitic capacitance between the wiring or between the wiring and the contact plug can be reduced because the spacers, which are composed of the silicon oxide based materials with low dielectric constants, are formed on the sidewalls of the wiring.

BRIEF DESCRIPTION OF THE DRAWINGS

The above and other features and advantages of the present invention will become more apparent to those of ordinary skill in the art by describing in detail embodiments thereof with reference to the attached drawings, in which.

DETAILED DESCRIPTION OF THE INVENTION

Figure 1A:
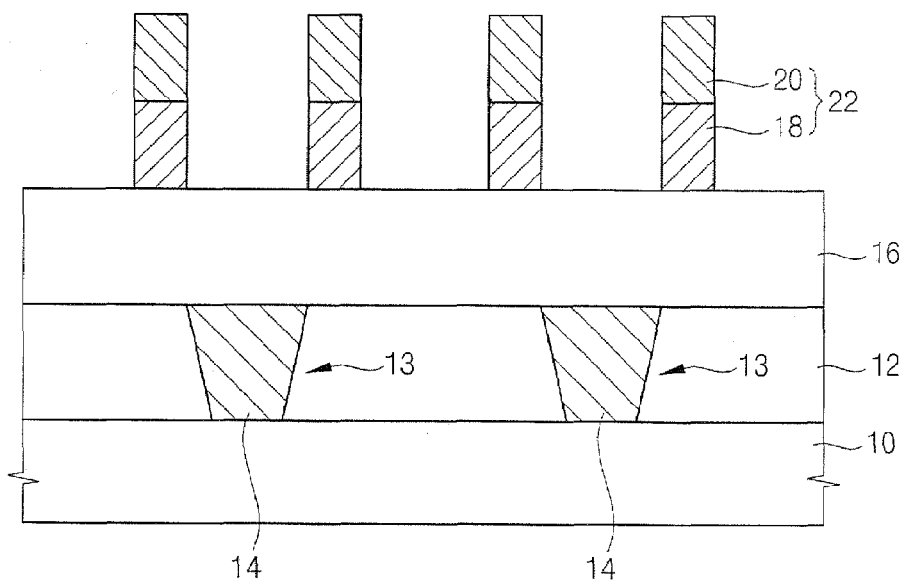
FIGS. 1A to 1C are cross-sectional views illustrating a conventional method of manufacturing a semiconductor device having a self-aligned contact structure.
Figure 1B:
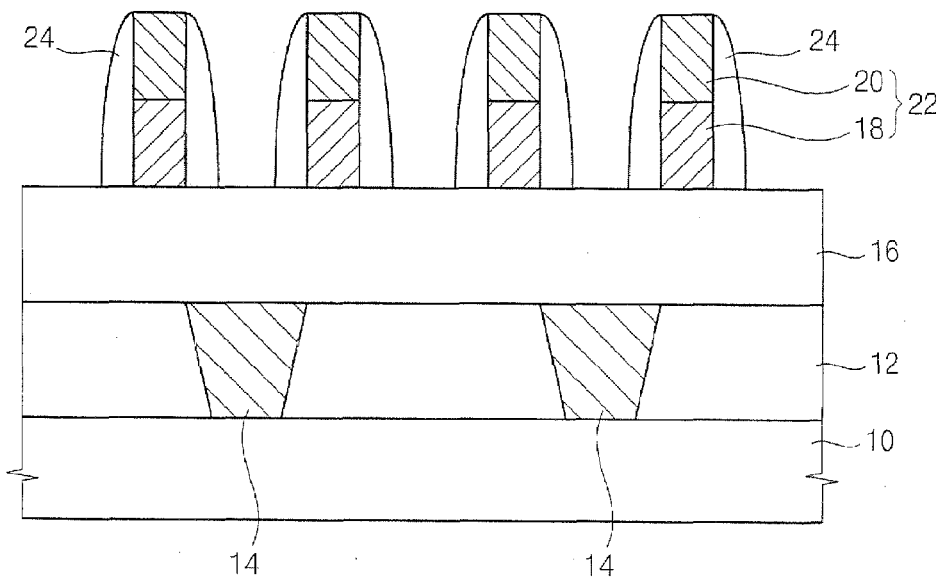
Figure 1C:
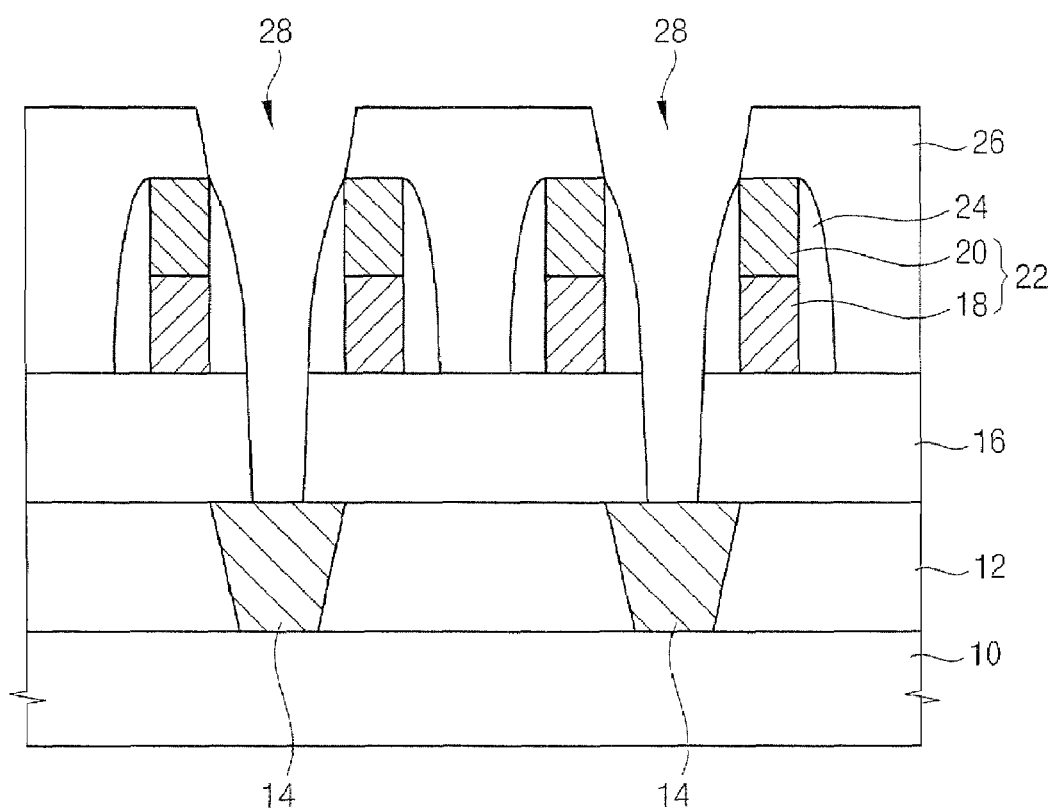

The invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be through and complete, and will fully covey the scope of the invention to those of ordinary skill in the art. In the drawings, like reference characters refer to like element throughout.

EMBODIMENT 1

FIGS. 2A to 2F are cross-sectional views illustrating a method of manufacturing a semiconductor device according to a first embodiment of the present invention.

Figure 2A:
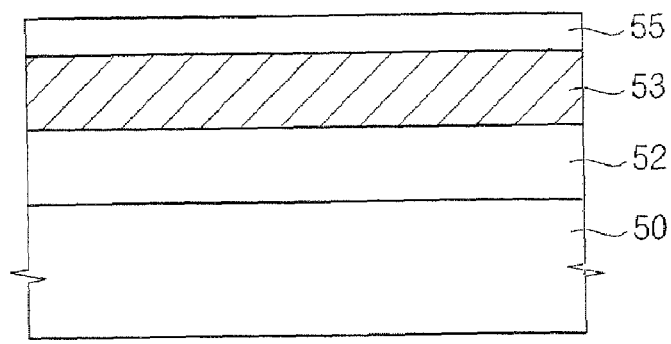
FIGS. 2A to 2F are cross-sectional views illustrating a method of manufacturing a semiconductor device according to one embodiment of the present invention.

Referring to FIG. 2A, a first insulating film 52, a conductive film 53, and a second insulating film 55 are successively formed on a semiconductor substrate 50. That is, a silicon oxide based material is deposited on the semiconductor substrate 50 to form the first insulating film 52, and then the conductive film 53 is formed on the first insulating film 52. Preferably, the conductive film 53 includes a composite film that has a first film composed of a first metal and/or a compound of the first metal, e.g., titanium (Ti)/titanium nitride (TiN), and a second film composed of a second metal, e.g., tungsten (W). Next, silicon nitride is deposited on the conductive film 53 to form the second insulating film 55.

Alternatively, before forming the conductive film 53, the first insulating film 42 can be partially etched by a photolithographic process to form first contact holes (not shown) and expose lower regions of the first insulating film 52. Then, when the conductive film 53 is formed on first insulating film 52, it would be electrically connected to the lower regions of the first insulating film 52 through the first contact holes.

Additionally, though it is not shown, first contact plugs including a barrier metal film and a metal film can be formed in the first contact holes before forming the conductive film 53. In this instance, the barrier metal film is formed in the first contact holes and on the first insulating film 52, and then the metal film is formed on the barrier metal film to fill up the first contact holes. Next, the metal film on the first insulating film 52 is removed to form the first contact plugs in the first contact holes, respectively. In this instance, the barrier metal film would include Ti/TiN and the metal film includes W. Then, after the first contact plugs are formed, the conductive film 53 would be formed to have only one film composed of a metal, e.g., W.

Figure 2B:
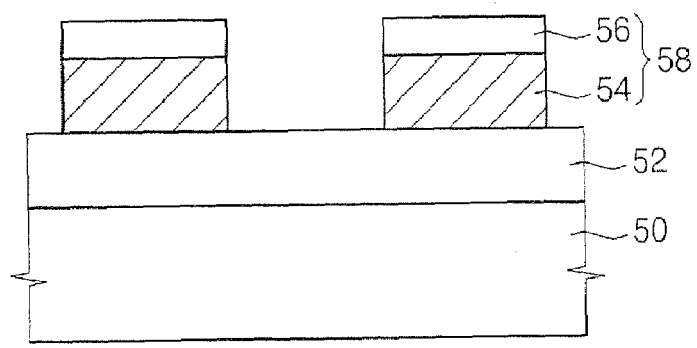

Referring to FIG. 2B, the second insulating film 55 and the conductive film 53 are patterned to form wiring 58 on the first insulating film 52. After coating a first photoresist film (not shown) on the second insulating film 55, the first photoresist film is exposed and developed to form a first photoresist pattern (not shown). Using the first photoresist pattern as an etching mask, the second insulating film 55 and the conductive film 53 are sequentially etched so that the wiring 58, which includes a conductive film pattern 54 and a second insulating film pattern 56, is formed on the first insulating film 52.

Alternatively, after etching the second insulating film 55 using the first photoresist pattern, the conductive film 53 can be etched using the second insulating film pattern 56 as an etching mask, thereby forming the conductive film pattern 54.

As the maximum design limitation of a pattern decreases, the process of forming the pattern may fail because of the etching selectivity of a photoresist film being lowered relative to the underlying film that is to be patterned. Thus, when a semiconductor device has a design limitation for a pattern of about 0.1 um or less, it is preferred to pattern the underlying film using a hard mask that is composed of a material having an etching selectivity relative to the underlying layer. In one embodiment of this invention, the second insulating film pattern 56 serves as a capping film for the conductive film pattern 54, while it is also used as a hard mask for patterning the conductive film 53.

Figure 2C:
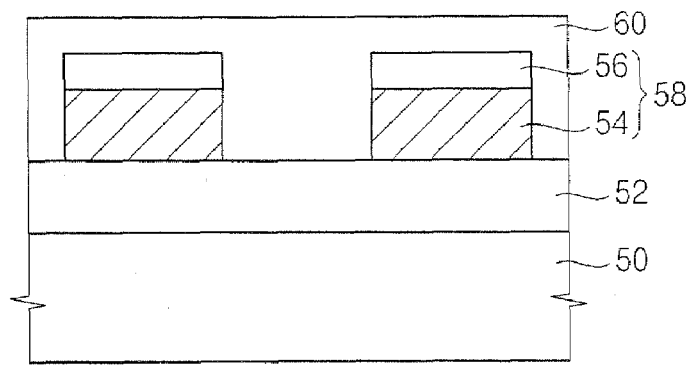

Referring to FIG. 2C, after forming the wiring 58 as described above, a third insulating film 60 for an interlayer dielectric film is formed on the first insulating layer 52 and on the wiring 58. Particularly, a silicon oxide based material, such as undoped silicate glass (USG), high density plasma (HDP) oxide, or chemical vapor deposition (CVD) oxide, is deposited on a surface of the resultant structure including the wiring 58 so as to form the third insulating film 60. When the third insulating film 60 includes an oxide that requires a baking process at a high temperature after depositing, such as a high temperature oxide (HTO) deposited at a high temperature, or an oxide like boro-phosphor silicate glass (BPSG) or spin on glass (SOG), tungsten (W) is oxidized so that the conductive film 53 includes tungsten (W) because a sidewall of the conductive film pattern 56 is exposed.

To settle such a problem, it is preferable that the third insulating film 60 is formed by a high density plasma (HDP) process wherein the formation of the third insulating film 60 is accomplished at a low temperature and the third insulating film 60 fills up a gap without a generation of a void therein.

The third insulating film 60 serves as an interlayer dielectric film for isolating the wiring 58 from a second contact plug, which is formed in a subsequent process. At this time though, a predetermined upper portion of the third insulating film 60 is planarized by a chemical mechanical polishing (CMP) process or an etch-back process.

Figure 2D:
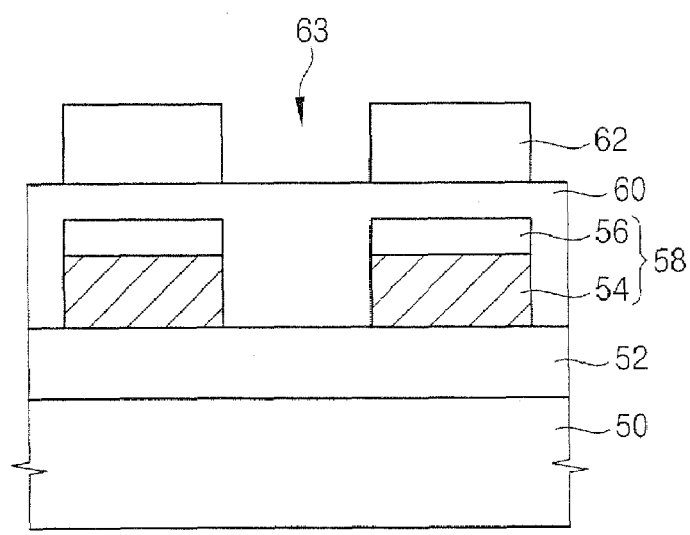

Referring to FIG. 2D, a contact pattern 62 defining a second contact hole 63 that exposes a portion of the third insulating film 60 positioned on a portion of the first insulating film 52 is formed. In particular, a material having an etching selectivity relative to the third insulating film 60 of the silicon oxide based material, e.g., silicon nitride or polysilicon, is deposited on the planarized third insulating film 60, thereby forming a fourth insulating film (not shown) on the third insulating film 60. After coating a second photoresist film (not shown) on the fourth insulating film, the second photoresist film is exposed and developed to form a second photoresist pattern (not shown) on the third insulating film 60.

With the second photoresist pattern as an etching mask, the fourth insulating film is etched to form the contact pattern 62 and furthermore defining the second contact hole 63. Then, the second photoresist pattern is removed from the contact pattern 62 by ashing and stripping processes.

To prevent the underlying wiring 58 from being attacked by over-etching the fourth insulating film, it is preferable that the contact pattern 62 is formed to have a width wider than that of the wiring 58. At this time, an interval between adjacent contact patterns 62 is determined by the design limitations of the second contact hole 63. When the contact pattern 62 is formed using silicon nitride, the contact pattern 62 can be utilized as an interlayer dielectric film for isolating a second contact plug formed in the second contact hole 63 from an adjacent second contact plug.

Figure 2E:
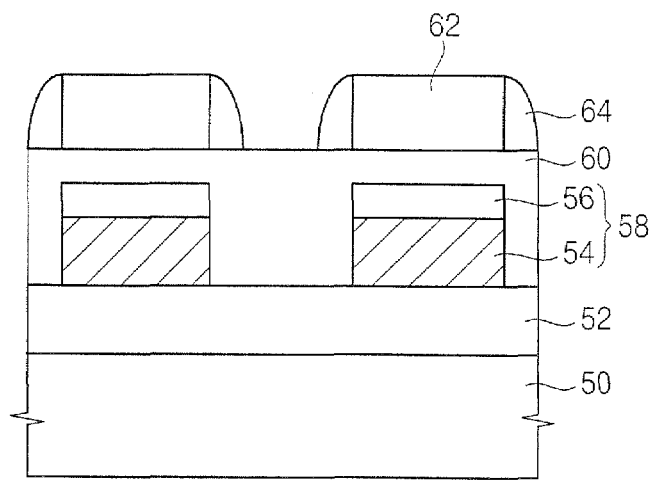

Referring to FIG. 2E, a contact spacer 64 is formed on a sidewall of the contact pattern 62. Particularly, a material having an etching selectivity relative to the silicon oxide based third insulating film 60, e.g., silicon nitride or polysilicon, is deposited on a surface of the resultant structure that includes the contact pattern 62 so that a fifth insulating film (not shown) is formed on the third insulation film 60 and the contact pattern 62. Then, the fifth insulating film is anisotropically etched to form the contact spacer 64 on the sidewall of the contact pattern 62.

Figure 2F:
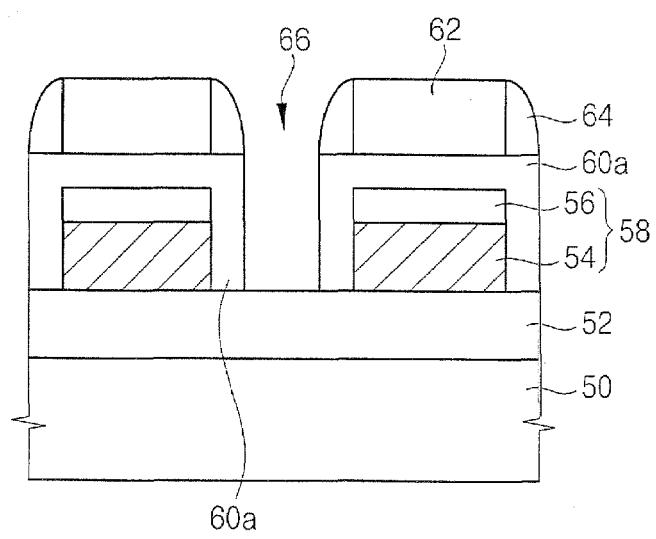

Referring to FIG. 2F, the second contact hole 66 that exposes the portion of the first insulating film 52 beneath the portion of the third insulating film 60 is completely formed. In detail, with the contact pattern 62 and the contact spacer 64 as one etching mask, the third and first insulating films 60 and 52 are anisotropically etched to form the second contact hole 66 exposing a portion of the first insulating film 52. Simultaneously, spacers composed of third insulating film patterns 60a are formed on the sidewalls of the wiring 58. Thus, the second contact hole 66 is formed to expose a portion of the first insulating film 52 while the second contact hole 66 contacts with outer surfaces of the third insulating film patterns 60a. At this time, the third insulating film patterns 60a, formed on the sidewalls of the wiring 58, are self-aligned relative to the contact spacers 64.

Then, a conductive material, e.g., a doped polysilicon or a metal, is deposited on a surface of the resultant structure including the second contact hole 66. The conductive material is then planarized to form the second contact plugs (not shown) involving a node separation by a planarization process like a CMP process or an etch-back process.

Alternatively, when the contact pattern 62 and the contact spacer 64 are formed using polysilicon, and the second contact plug is formed using doped polysilicon, the planarization process for node-separating the second contact plug is carried out such that the surface of the third insulating film pattern 60a is exposed, thereby completely removing the polysilicon film over the third insulating film pattern 60a. At this time, the third insulating film pattern 60a on the wiring 58 should remain with a sufficient thickness to ensure a node-separation margin of the second contact plug. That is, the third insulating film pattern 60a should have a sufficient thickness to prevent the conductive film pattern 54 from being attacked during the planarization process for node-separating the second contact plug.

According to present embodiment, the third insulating film 60, composed of silicon oxide, is etched using the contact pattern 62 and the contact spacer 64, which are composed of silicon nitride, to thereby form the second contact hole 66 between the wiring 58. A thickness of the second insulating film pattern 56 used for patterning the wiring 58 may be minimized because the contact pattern 62 and the contact spacer 64 together protect the underlying conductive film pattern 54 during the etching process for forming the second contact hole 66. Thus, an aspect ratio of the wiring 58 can be greatly decreased and a gap-fill margin between adjacent wiring 58 can be improved.

In addition, because the thickness of the second insulating film pattern 56 is minimized, the photolithographic process for forming the wiring 58 can be easily accomplished even though the design limitations of the pattern may be reduced.

Additionally, the second contact hole 66 between the adjacent wiring 58 is not formed by a self-aligned contact etching process, and thus a shoulder margin of the wiring 58 can be maintained to prevent an electrical short-circuit between the wiring 58 and the second contact plug.

Moreover, a parasitic capacitance between the adjacent wiring 58 or between the wiring 58 and the second contact plug can be reduced because the spacers 64 formed on the sidewalls of the wiring 58 from the third insulating film patterns 60a, i.e., the silicon oxide film patterns, have relatively low dielectric constants.

EMBODIMENT 2

Figure 3A:
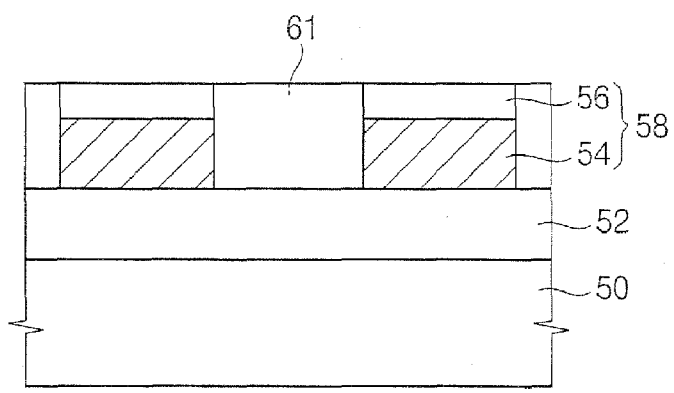
FIGS. 3A and 3B are cross-sectional views illustrating a method of manufacturing a semiconductor device according to another embodiment of the present invention.
Figure 3B:
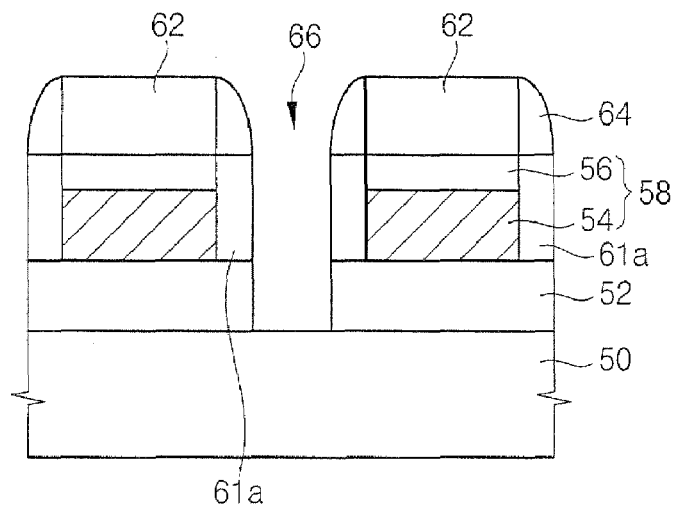

FIGS. 3A and 3B are cross-sectional views illustrating a method of manufacturing a semiconductor device according to a second embodiment of the present invention. The method of the present embodiment is substantially similar to embodiment 1 except it specifies planarizing the third insulating film 61 until the surfaces of the wiring 58 is exposed.

Referring to FIG. 3A, with processes substantially identical to those described in FIGS. 2A and 2B, after a first insulating film 52 is formed on a semiconductor substrate 50, the wiring 58 including conductive film patterns 54 and second insulating film patterns 56 are formed on the first insulating film 52.

Then, a silicon oxide based material is deposited on a surface of the resultant structure including the wiring 58 to form a third insulating film 61. Using a planarization process, such as a CMP process or an etch-back process, the third insulating film 61 is partially removed until the surfaces of the second insulating film patterns 56 are exposed.

Referring to FIG. 3B, contact patterns 62, contact spacers 64, and second contact hole 66 are sequentially formed using processes substantially identical to those described in FIGS. 2D to 2F. Particularly, a material having an etching selectivity relatively to the third insulating film 61 is deposited on the third insulating film 61 to cover the wiring 58. Next a fourth insulating film (not shown) is formed on the third insulating film 61 and on the wiring 58. At this time, the fourth insulating film may be planarized. A photolithographic process is now employed to pattern the fourth insulating film so that the contact patterns 62 are formed to define the second contact hole 66 exsposing a portion of the first insulating film 52.

Then, a material having an etching selectivity relative to the third insulating film 61, which is composed of the silicon oxide based material, the new material being, for example, a silicon nitride or polysilicon, is deposited on a surface of the resultant structure including the contact patterns 62, to thereby form a fifth insulating film (not shown) on the resultant structure. The fifth insulating film is anisotropically etched to form the contact spacers 64 on the sidewalls of the contact patterns 62, respectively.

Thereafter, using the contact patterns 62 and the contact spacers 64 as etching masks, the third insulating film 61 and the first insulating film 52 are anisotropically etched to form the second contact hole 66 exposing portion of the first insulating film 52. Simultaneously, the third insulating film patterns 61a are formed on the sidewalls of the wiring 58.

During the etching of the first and third insulating films 52 and 61, which are composed of silicon oxide, the contact patterns 62 and the contact spacers 64, which are composed of silicon nitride, can protect the conductive film patterns 54 together with the second insulating film patterns 56. Thus, a thickness of the second insulating film 56 can be minimized and the aspect ratios of the wiring 58 can be decreased.

In addition, shoulder margins of the wiring 58 can be maintained by the contact patterns 62 and the contact spacers 64 to prevent the wiring 58 from being exposed during the etching process of forming the second contact hole 66. Accordingly, short-circuits between the wiring 58 and the second contact plugs can be prevented.

Subsequently, after a conductive material, e.g., doped polysilicon or metal, is deposited on a surface of the resultant structure including the second contact hole 66, the conductive material is planarized. A node separation can be achieved by a planarization process like a CMP process or an etch-back process so that the second contact plug (not shown) is formed in the second contact hole 66. At this time, parasitic capacitance between adjacent wiring structures 58 or between the wiring 58 and the second contact plug can be reduced because the spacers are made of the third insulating film patterns 61a, which is composed of the silicon oxide based material having a low dielectric constant.

EMBODIMENT 3

Figure 4:
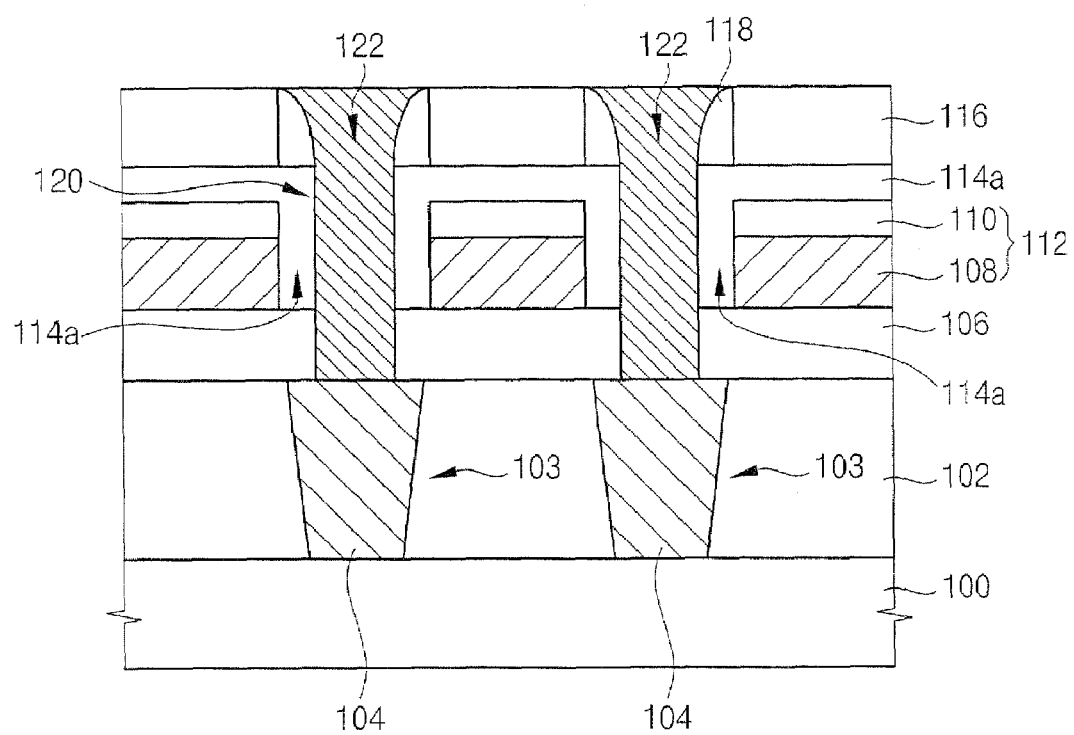
FIG. 4 is a cross-sectional view illustrating a DRAM device according to one embodiment of the present invention.

FIG. 4 is a cross-sectional view of a DRAM device in accordance with a third embodiment of the present invention.

Referring to FIG. 4, metal oxide semiconductor (MOS) transistors (not shown) having gate electrodes for word lines, capacitor contact regions (source regions), and bit line contact regions (drain regions), are formed on a semiconductor substrate 100. Each gate electrode includes a gate insulating film, a gate capping film composed of silicon nitride and a gate sidewall spacer composed of silicon nitride.

An interlayer dielectric film 102, composed of silicon oxide, is formed on the substrate 100 to cover the MOS transistors. Contact holes 103 penetrate the interlayer dielectric film 102 to expose the source/drain regions. The contact holes 103 are self-aligned relative to the gate electrodes, respectively. Pad electrodes 104, composed of doped polysilicon, are formed in the self-aligned contact holes 103, respectively. The pad electrodes 104 are node-separated by a planarization process like a CMP process or an etch-back process. In the present embodiment, the capacitor contact regions can be in contact with the pad electrodes 104 formed thereon, and the bit line contact regions can further be in contact with other pad electrodes 104 formed thereon. That is, some pad electrodes 104 contact the source regions while other pad electrodes 104 contact the drain regions.

A first insulating film 106, composed of a silicon oxide based material, is formed on the interlayer dielectric film 102 and on the pad electrodes 104. A plurality of bit lines 112 are formed on the first insulating film 106.

Though it is not shown, bit-line contact holes penetrating the first insulating film 106 are formed to expose the underlying bit line contact regions. Each bit line 112 is connected to the pad electrode 104 positioned on the bit-line contact region corresponding to the drain region through the bit line contact hole.

The bit lines 112 include first conductive film patterns 108 and second insulating film patterns 110 stacked on the first conductive film patterns 108, respectively. Third insulating film patterns 114a, composed of silicon oxide based materials, are further formed on surfaces and sidewalls of the bit lines 112. Contact patterns 116, composed of a material having an etching selectivity relative to the silicon oxide based material, e.g., silicon nitride, are formed on the third insulating film patterns 114a, respectively. Contact spacers 118, composed of a material having an etching selectivity relative to silicon oxide based material like silicon nitride, are respectively formed on sidewalls of the contact patterns 116.

Storage node contact holes 120 are defined by the contact patterns 116 and the contact spacers 118. Each storage node contact hole 120 is bordered by a surface of the third insulating film pattern 114a on the sidewall of the bit line 112. This exposes the capacitor contact region including the pad electrode 104 formed thereon between adjacent the bit lines 112. Accordingly, the third insulating film patterns 114a on the sidewalls of the bit lines 112 are self-aligned relative to the contact spacers 118.

In the storage node contact holes 120, storage node contact plugs 122, composed of doped polysilicon or metal, are formed in the storage node contact holes 120, and are node-separated by a planarization process. With the planarization process, the storage node contact plugs 122 are planarized until the surfaces of the contact patterns 116 are exposed.

In the DRAM device of the present embodiment, a thickness of the second insulating film pattern 110 can be minimized due to the contact patterns 116 and the contact spacers 118 composed of silicon nitride. Thus, the aspect ratio of the bit lines 112 decreases while a gap-fill margin between adjacent bit lines 112 increases.

Additionally, shoulder margins of the bit lines 112 can be maintained due to the contact patterns 116 and the contact spacers 118, thereby preventing electrical shorts between the bit lines 112 and the storage node contact plugs 122.

Furthermore, a parasitic capacitance, i.e., a bit-line loading capacitance, between the adjacent bit lines 112 or between the bit line 112 and the storage node contact plug 122 can be reduced because the bit lines 112 include spacers of silicon oxide having a low dielectric constant, i.e., the third insulating film pattern 114a. When the bit-line loading capacitance decreases by an amount of about 25~30%, the number of the cells per unit bit line increases to improve the cell efficiency and also to increase the number of usable chips per a wafer.

FIGS. 5A to 5H are cross-sectional views illustrating a method of manufacturing the DRAM device in FIG. 4.

Figure 5A:
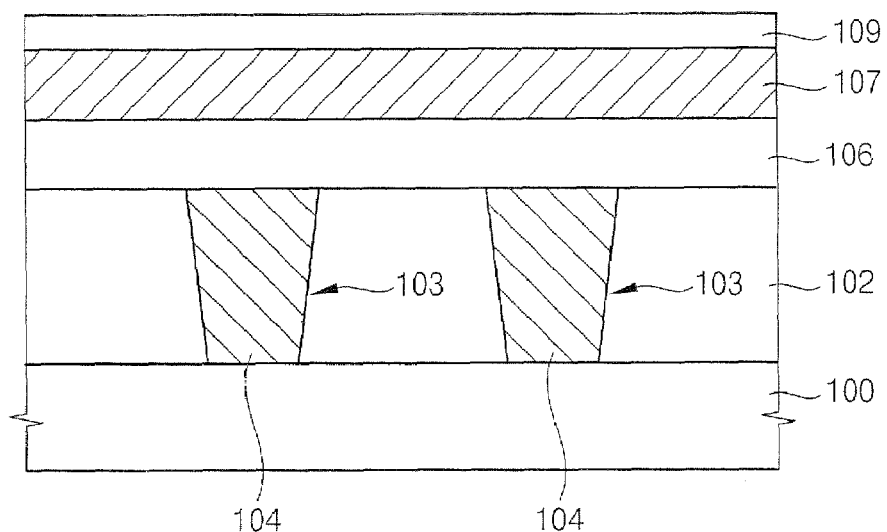
FIGS. 5A to 5H are cross-sectional views illustrating a method of manufacturing the DRAM in FIG. 4.

FIG. 5A illustrates forming pad electrodes 104, a first insulating film 106, a first conductive film 107, and a second insulating film 109 on a semiconductor substrate 100.

After the semiconductor substrate 100 is divided into field regions and active regions by a local oxidation of silicon (LOCOS) process or a shallow trench isolation (STI) process, MOS transistors (not shown) are formed on the active regions of the substrate 100. In particular, after growing a thin gate oxide film in the active region by a thermal oxidation process, a gate conductive film and a gate capping film are sequentially formed on the gate oxide film. The gate conductive film and the gate capping film are patterned by a photolithographic process, thereby forming gate electrodes serving as word lines on the substrate 100. Then, gate spacers are formed on sidewalls of the gate electrodes, respectively. Preferably, the gate capping film and the gate spacers are formed using silicon nitride.

Subsequently, using an ion implantation process, source/drain regions are formed in a surface of the substrate 100 exposed between the gate electrodes. Alternatively, before forming the gate spacers, a light doped drain (LDD) ion implantation process may be carried out to form lightly doped source/drain regions in the surface of the substrate 100 between the gate electrodes, thereby achieving source/drain regions having LDD structures. Some source/drain regions correspond to capacitor contact regions connected to storage electrodes of capacitors while other source/drain regions fall under bit line contact regions connected to bit lines. In the present embodiment, source regions become the capacitor contact regions and the drain regions become the bit line contact regions.

Thereafter, an interlayer dielectric film 102, composed of an oxide such as BPSG, is formed on a surface of the substrate 100 including the MOS transistors. Then, the interlayer dielectric film 102 is planarized by a CMP process using the gate capping film composed of silicon nitride as a stopper. Subsequently, the interlayer dielectric film 102 is anisotropically etched under an etching condition having a high etching selectivity relative to the gate capping film which is composed of silicon nitride, thereby forming contact holes 103 and exposing the source/drain regions. At this time, the contact holes 103 are self-aligned relative to the gate electrodes.

After a polysilicon film, doped with a high concentration impurity, is formed to fill up the contact holes 103, the polysilicon film is removed where a surface of the gate capping film is exposed. Thus, pad electrodes 104 contacting with the source/drain regions are formed in the contact holes 103, respectively.

Next, a silicon oxide based material like BPSG, USG, HDP oxide, CVD oxide, etc., is deposited upon a surface of the substrate 100 including the pad electrodes 104, to a thickness of about 1,000~3,000 Å. This process forms a first insulating film 106 on the pad electrodes 104 and on the interlayer dielectric film 102. The first insulating film 106 serves as another interlayer dielectric film for isolating the pad electrodes 104 from bit lines successively formed thereon.

After forming the first insulating film 106, the surface of the first insulating film 106 may be planarized by a CMP process or an etch-back process to ensure a margin for a subsequent photolithographic process. In this case, a planarization process for the first insulating film 106 should be carried out such that the thickness of the first insulating film 106 remains about 1,000~3,000 Å beneath the bit lines.

The first insulating film 106 is then partially etched by a photolithographic process, thereby forming bit line contact holes (not shown) exposing the pad electrodes 104 positioned on the drain regions. A first conductive film 107 for the bit lines is formed on the first insulating film 106 to fill up the bit line contact holes. A second insulating film 109, composed of silicon nitride, is formed on the first conductive film 107.

Alternatively, the first conductive film 107 can be formed as a composite film including a first film composed of a first metal and/or a compound of the first metal, e.g., titanium (Ti)/titanium nitride (TiN), and a second film composed of a second metal, e.g., tungsten (W). The second insulating film 109 serving as a mask for forming the bit lines protects the underlying first conductive film 107 during a subsequent etching process.

According to a conventional method, a bit line mask layer is formed to have a large thickness of about 3,000 Å because it is only the bit line mask layer to protect the surface of a conductive for the bit lines during an etching process for contacts. However, in the present invention, the surface of the first conductive film 107 is protected by the second insulating film 109 together with a third insulating film and contact patterns successively formed on the second insulating film 109 in a subsequent process. Hence, the second insulating film 109 can be formed to have a smaller thickness of about 1,000~1,500 Å. Because the thickness of the second insulating film 109 for the bit line mask can be reduced by an amount of about 50%, a photolithographic process for forming the bit lines can be easily performed and a gap-fill margin of the third insulating film formed on the bit lines can be increased.

As described above, the first conductive film 107 including two films are in direct contact with the bit line contact holes. Alternatively, the first conductive film 107 can directly contact the bit line contact plugs after the bit line contact plugs are formed in the bit line contact holes. Particularly, after forming the bit line contact holes, a barrier metal film composed of Ti/TiN and a metal film composed of W are formed on the first insulating film 106 to fill up the bit line contact holes. The metal film is then removed by a CMP process until the surface of the first insulating film 106 is exposed, thereby forming bit line contact plugs that include the barrier metal film and the metal film. After forming the bit line contact plugs as described above, the first conductive film 107 composed of a metal, e.g., W, is formed on the bit line contact plugs and on the first insulating film 106. When the bit line contact plugs are formed by this method, the first conductive film 107 for bit lines is made of one film.

Figure 5B:
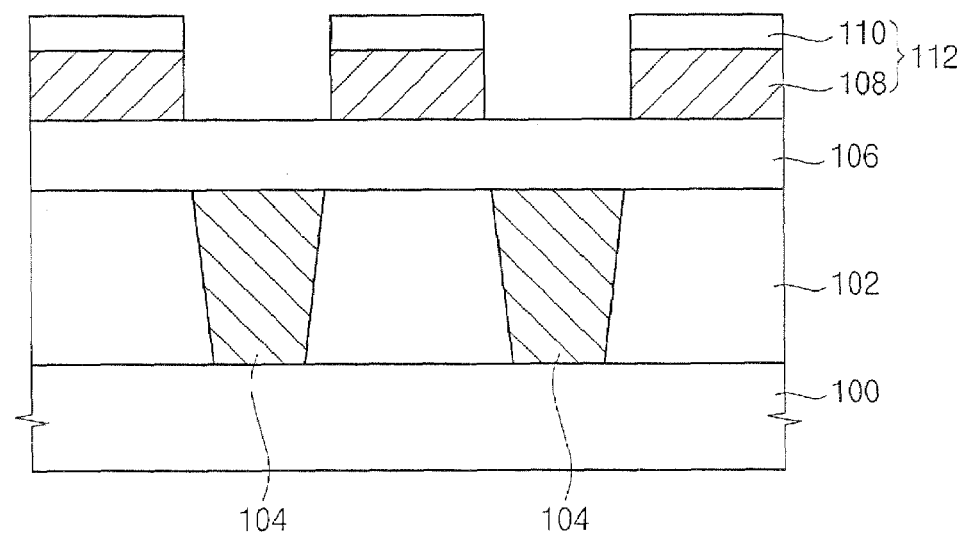

FIG. 5B illustrates another section of the method including forming the bit lines 112 on the first insulating film 106. First photoresist patterns (not shown) for patterning the bit lines are formed on the second insulating film 109. Using first photoresist patterns as etching masks, the second insulating film 109 and the first conductive film 107 are sequentially etched to form the bit lines 112 including second insulating film patterns 110 and first conductive film patterns 108.

Alternatively, after etching the second insulating film 109 using the first photoresist patterns as etching masks to form the second insulating film patterns 110, the first conductive film 107 can be etched using the second insulating film patterns 110 as etching masks. This process is more preferable for DRAM devices having a design limitation of about 0.1 um or less. At this time, the second insulating film pattern 110 serves as a capping film for the first conductive film pattern 108 and also as a hard mask for forming the bit lines 112.

Alternatively, before forming the first photoresist patterns, an anti-reflective film may be formed on the second insulating film 109 to ease the performance of the photolithographic process. The anti-reflective film may be made of single film using silicon oxynitride (SiON) or a plurality of films using high temperature oxide (HTO) film and SiON film. The anti-reflective film prevents a reflection of light from the substrate 100 during a subsequent photolithographic process, which eases the formations of the photoresist patterns.

Figure 5C:
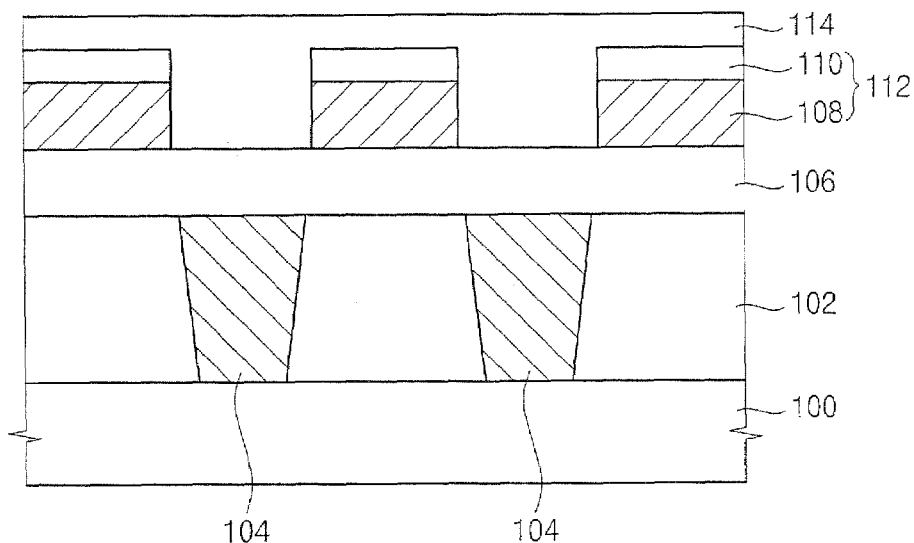

FIG. 5C illustrates forming the third insulating film 114 on the bit lines 112 and on the first insulating film 106. After forming the bit lines 112 as described above, a silicon oxide based material like USG, HDP oxide, CVD oxide, etc., is deposited on the first insulating film 106 on which the bit lines 112 are formed, thereby forming the third insulating film 114 on the bit lines 112 and on the first insulating film 106.

When the first conductive film pattern 108 includes tungsten (W) and the third insulating film 114 includes an oxide like HTO deposited at a high temperature or an oxide like BPSG or SOG requiring a baking process at a high temperature after depositing, the tungsten (W) is oxidized because sidewalls of the first conductive film patterns 108 are exposed. To alleviate this problem, it is preferable that the third insulating film 114 is formed by an HDP process because formation of the third insulating film 114 is executed at a low temperature and the gap-fill is accomplished without generating voids in the third insulating film 114.

Then, a predetermined upper portion of the third insulating film 114 is planarized by a CMP process or an etch-back process.

Figure 5D:
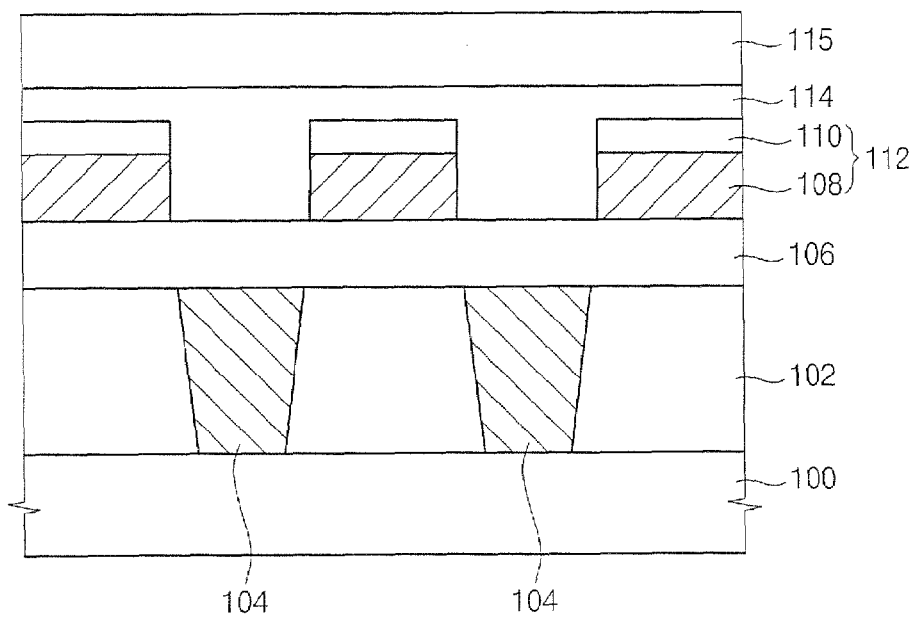

FIG. 5D illustrates forming a fourth insulating film 115 on the third insulating film 114. A material having an etching selectivity relative to the third insulating film 114 composed of a silicon oxide based material, such as silicon nitride, is deposited to have a thickness of about 1,000~1,500 Å on the planarized third insulating film 114, thereby forming fourth insulating film 115 on the third insulating film 114.

Figure 5E:
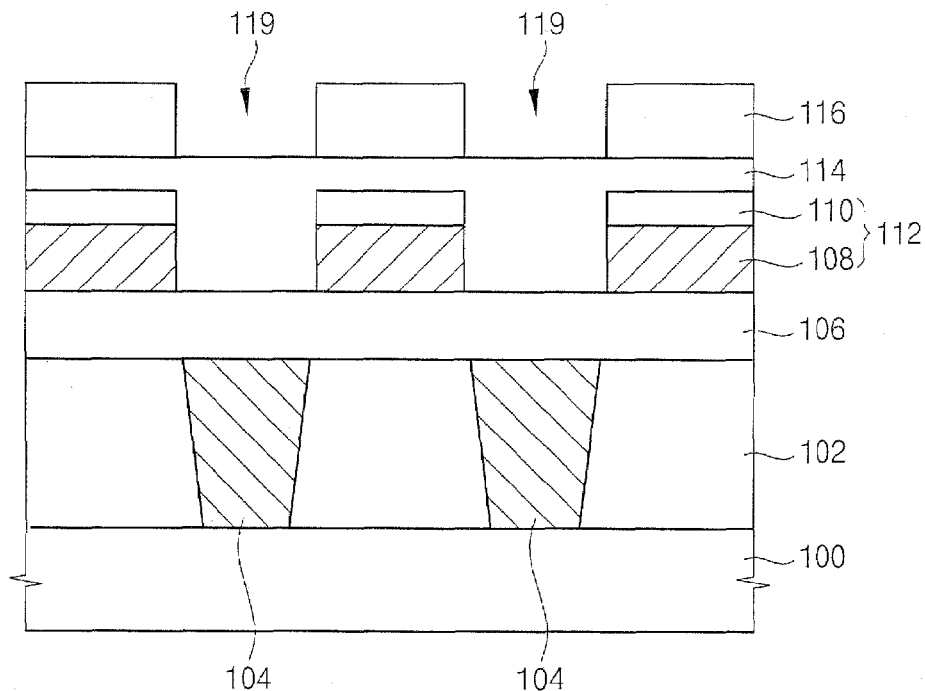

FIG. 5E illustrates forming contact patterns 116 on the third insulating film 114.

Second photoresist patterns (not shown) are formed on the fourth insulating film 115. Using the second photoresist patterns as etching masks, the fourth insulating film 115 is etched to form the contact patterns 116 that define storage node contact hole regions 119. Then, the second photoresist patterns are removed by an ashing process and a stripping process.

To prevent the underlying bit lines 112 from being attacked due to an over-etch caused by etching the fourth insulating film 115, the contact pattern 116 is preferably formed to have a width wider than that of the bit line 112. At this time, an interval between adjacent contact patterns 116 is determined by a design limitation of the storage node contact hole. The contact patterns 112 of silicon nitride can be utilized as interlayer dielectric films for isolating adjacent storage node contact plugs, which are formed in the storage node contact holes in a subsequent process.

Figure 5F:
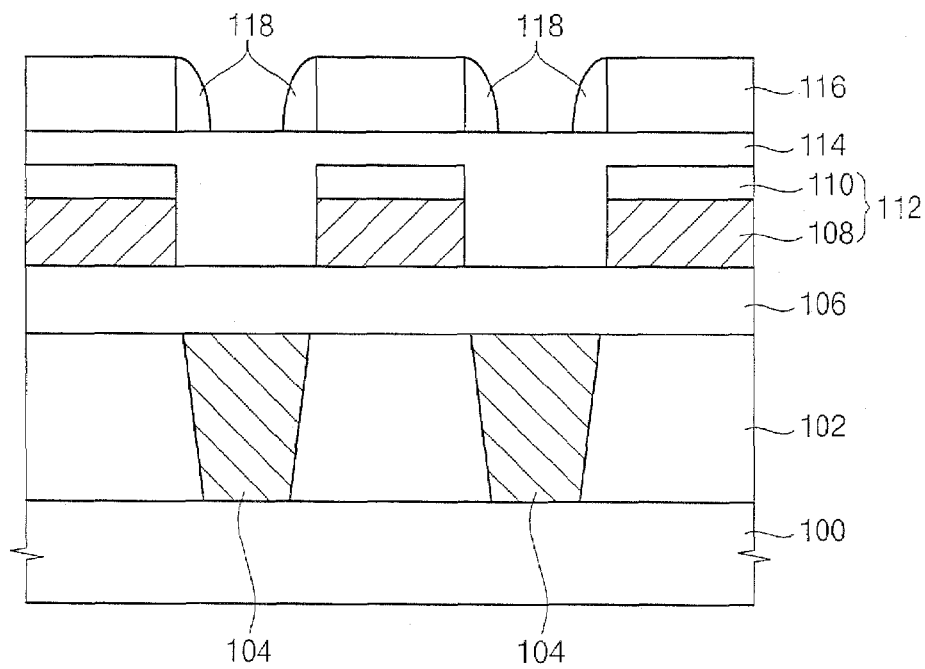

FIG. 5F illustrates forming contact spacers 118 on the sidewalls of the contact patterns 116. A material having an etching selectivity relative to the silicon oxide based third insulating film 114, such as silicon nitride or polysilicon, is deposited to have a thickness of about 300~600 Å on the resultant structure on which the contact patterns 116 are formed, thereby forming a fifth insulating film (not shown).

Then, the fifth insulating film is anisotropically etched to form the contact spacers 118 on the sidewalls of the contact patterns 116.

Figure 5G:
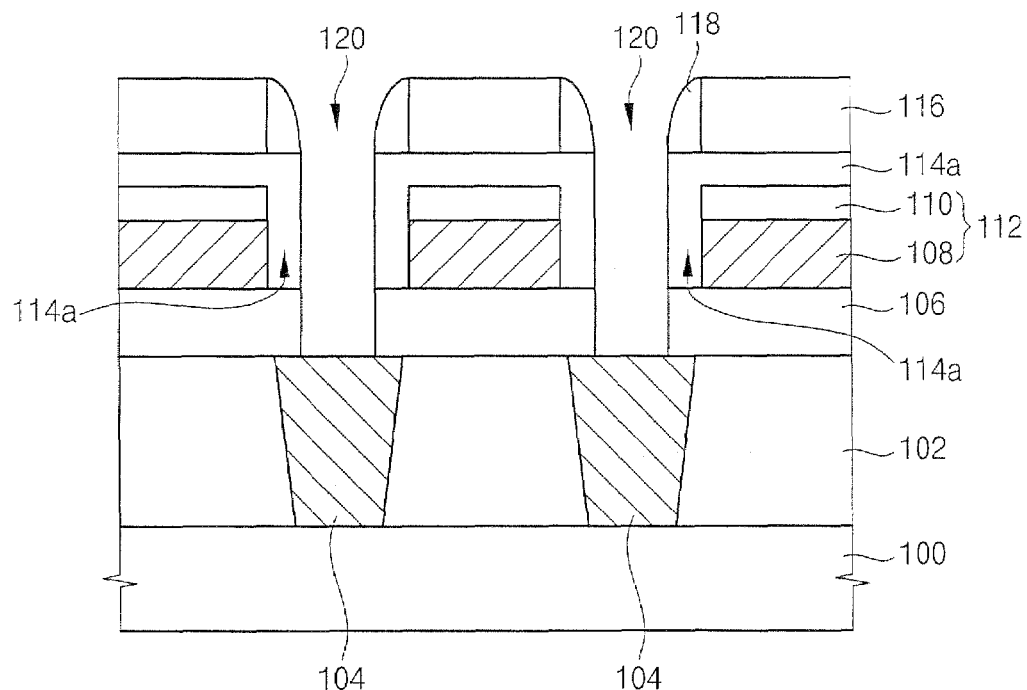

FIG. 5G illustrates forming the storage node contact holes 120 exposing the pad electrodes 104. Using the contact patterns 116 and the contact spacers 118 as etching masks, the first and third silicon oxide insulating films 106 and 114 are sequentially and anisotropically etched to form the storage node contact holes 120 exposing the pad electrodes 104 on the capacitor contact regions, i.e. the source regions, between the bit lines 112. This process also forms spacers, from the third insulating film patterns 114a, on the sidewalls of the bit lines 112. That is, the storage node contact holes 120 are close to outer surfaces of the third insulating film patterns 114a, thereby exposing the pad electrodes 104 on the capacitor contact regions between the adjacent bit lines 112.

In the previously described conventional method, a storage node contact hole is formed by a self-aligned contact etching process so that the bit-line mask layer and the bit line spacers, which are positioned on edge portions of the bit lines, are etched to ensure bit line shoulder margins. However, as the design rules become smaller, this process can be responsible for generating electrical short-circuits between the bit lines and the storage node contact plugs. Unlike the conventional method, the present invention specifies that the storage node contact holes 120 are formed using the contact patterns 116 and the contact spacers 118 as etching masks when the bit lines 112 are completely surrounded by the contact patterns 116, which have widths wider than those of the bit lines 112, and the contact spacers 118. Therefore, because the storage node contact holes 120 are not formed by a self-aligned contact etching process, the shoulder margin of the bit lines 112 can be sufficiently maintained, thereby preventing the electrical short-circuit between the bit lines 112 and the storage node contact plugs.

Figure 5H:
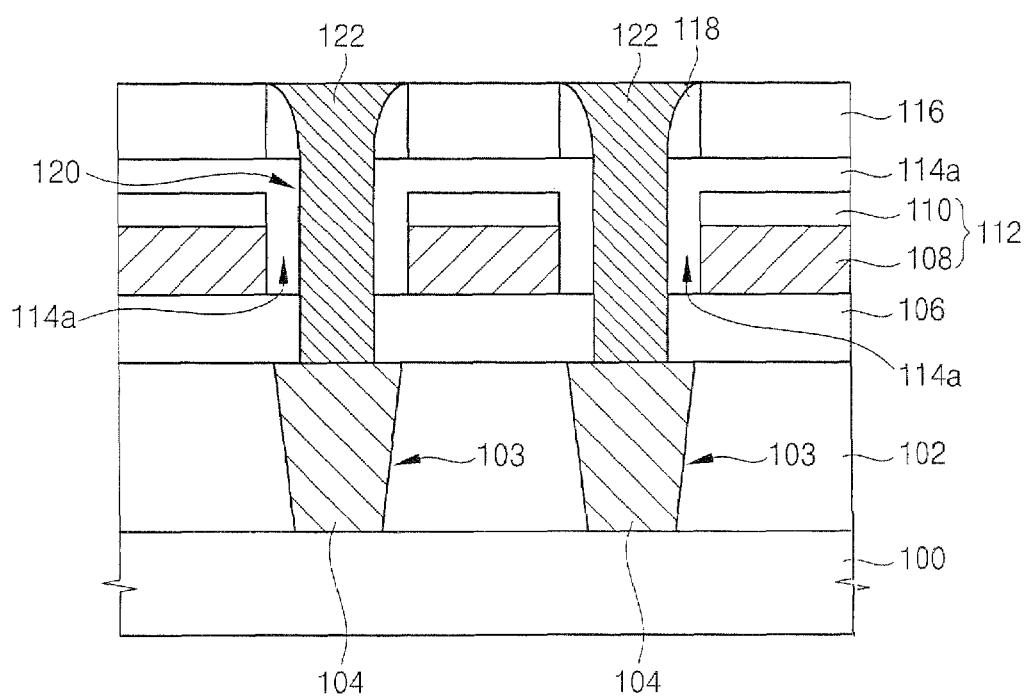

FIG. 5H illustrates forming the storage node contact plugs 122 in the storage node contact holes 120. After a second conductive film composed of doped polysilicon or metal is formed on a surface of the resultant structure, including the storage node contact holes 120, the second conductive film is removed by a CMP process or an etch-back process until the contact patterns 116 are exposed. As a result, node-separated storage node contact plugs 122 are formed in the storage node contact holes 120, respectively. In this case, the third insulating film patterns 114a formed on the surfaces and the sidewalls of the bit lines 112 isolate the bit lines 122 from the storage node contact plugs 122.

Additionally, capacitors (not shown) having storage electrodes, dielectric films, and plate electrodes, formed by general capacitor formation processes can be formed on the storage node contact plugs 122.

According to the present embodiment, the third insulating film 114 and the first insulating film 106 composed of silicon oxide are etched using the contact patterns 116 and the contact spacers 118 composed of silicon nitride, thereby forming the storage node contact holes 120 exposing the pad electrodes 104 between the bit lines 122. Thus, the thickness of the second insulating film pattern 110 used for forming the bit lines 122 can be minimized because the contact patterns 116 and the contact spacers 118 protect the underlying first conductive film patterns 108 during the etching process for forming the contacts 122. As a result, aspect ratios of the bit lines 112 can be greatly decreased while gap-fill margins between the adjacent bit lines 112 are improved.

In addition, the storage node contact hole 120 positioned between the bit lines 112 is not formed by a self-aligned contact etching process, thereby ensuring that a shoulder margin of the bit line 112 can be sufficiently maintained to prevent an electrical short-circuit between the bit line 112 and the storage node contact plug 122.

Furthermore, a bit line loading capacitance between the adjacent bit lines 112 or between the bit line 112 and the storage node contact plug 122 can be reduced because the spacers, including the third insulating film patterns 114a composed of the silicon oxide based material having a low dielectric constant, are formed on the sidewalls of the bit lines 112.

EMBODIMENT 4

Figure 6A:
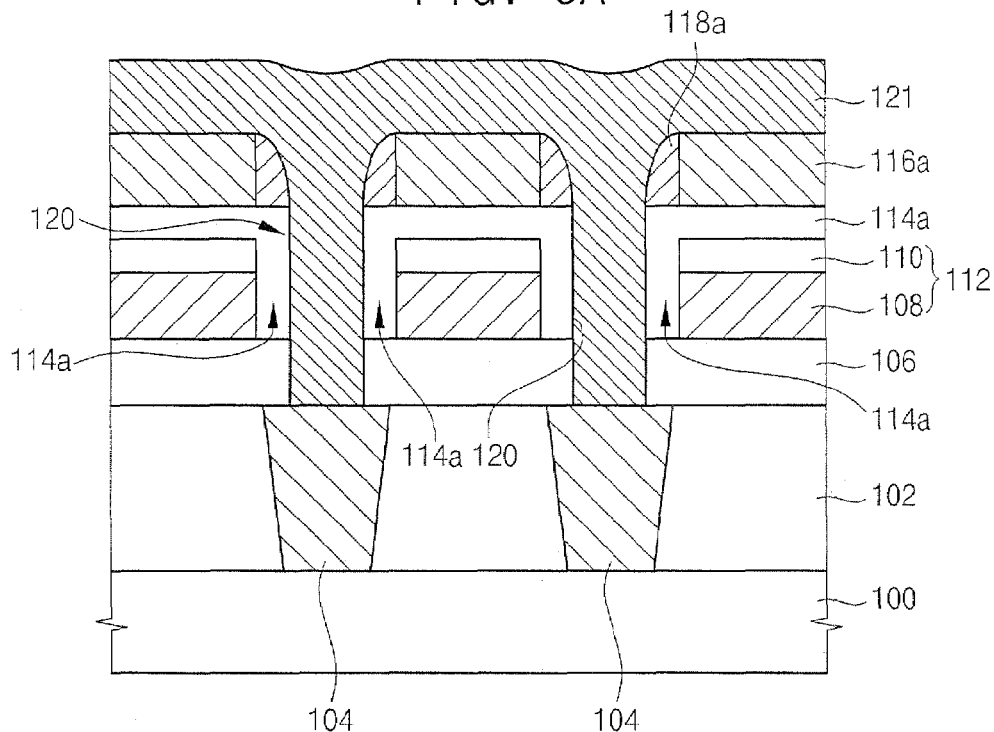
FIGS. 6A and 6B are cross-sectional views illustrating a method of manufacturing a DRAM device according to still another embodiment of the present invention.
Figure 6B:
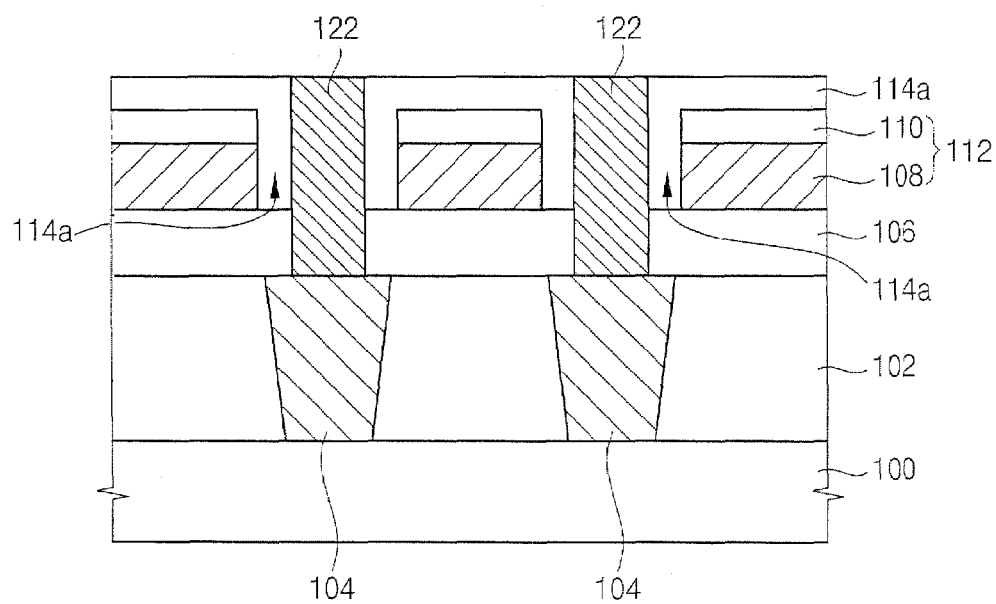

FIGS. 6A and 6B are cross-sectional views illustrating a method of manufacturing a DRAM device in accordance with a fourth embodiment of the present invention. The method of the present embodiment is substantially similar to the method of the embodiment 3 except for the construction of the storage node contact plugs 122.

Referring to FIG. 6A, using processes substantially identical to those described in FIGS. 5A to 5D, a first insulating film 106, bit lines 112 including first conductive film patterns 108 and second insulating film patterns 110, and a third insulating film 114 composed of a silicon oxide based material, are formed on a semiconductor substrate 100 where pad electrodes 104 are formed.

A predetermined portion of the third insulating film 114 is planarized by a CMP process or an etch-back process. After a first polysilicon film, with a high etching selectivity relative to silicon oxide, is formed on a surface of the resultant structure, the first polysilicon film is patterned by a photolithographic process to form contact patterns 116a that define storage node contact hole regions, respectively. A second polysilicon film having a high etching selectivity relative to silicon oxide is formed on a surface of the resultant structure including the contact patterns 116a. Then, the second polysilicon film is anisotropically etched to form contact spacers 118a on sidewalls of the contact patterns 116a.

Using the contact patterns 116a and the contact spacers 118a as etching masks, the third insulating film 114 and the first insulating film 106 are anisotropically etched to form the storage node contact holes 120 exposing the pad electrodes 104 positioned in capacitor contact regions corresponding to the source regions of the MOS transistors between adjacent bit lines 112. At the same time, third insulating film patterns 114a are formed to enclose the surfaces and sidewalls of the bit lines 112, respectively.

Thereafter, a highly-doped third polysilicon film 121, is deposited to have a sufficient thickness so that it fills up the storage node contact holes 120 and covers the resultant structure including the storage node contact holes 120.

Referring to FIG. 6B, the third polysilicon film 121 is planarized by a CMP process or an etch-back process to form the node-separated storage node contact plugs 122 filling the storage node contact holes 120. At this time, the contact patterns 116a and the contact spacers 118a are removed during the planarization of the third polysilicon film 121 because they are composed of polysilicon. The planarization process is carried out until surfaces of the third insulating film patterns 114a over the bit lines 112 are exposed, thereby forming the storage node contact plugs 122 having heights equal to the surfaces of the third insulating film patterns 114a. In this embodiment, to prevent the first conductive film patterns 108 for bit lines 112 from being attacked during the planarization process for a node separation, the third insulating film pattern 114a over the bit line 112 should remain with a sufficient thickness to ensure a node-separation margin of the storage node contact plug 122.

EMBODIMENT 5

FIGS. 7A to 7D are cross-sectional views illustrating a method of manufacturing a DRAM device in accordance with a fifth embodiment of the present invention. The method of this embodiment is substantially similar to the method of embodiment 3 except for the addition of planarizing a third insulating film 117.

Figure 7A:
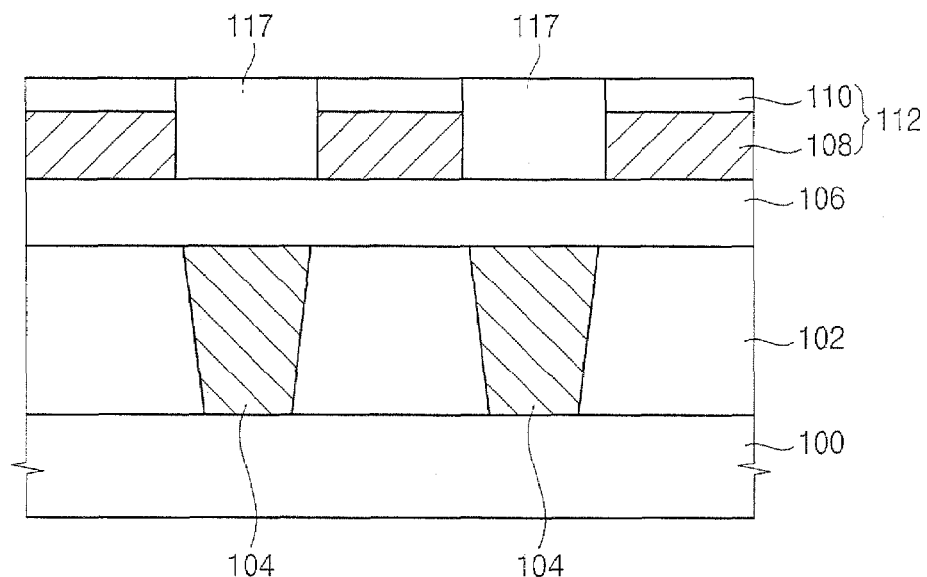
FIGS. 7A to 7D are cross-sectional views illustrating a method of manufacturing a DRAM device according to still another embodiment of the present invention.

Referring to FIG. 7A, using processes substantially identical to those described in FIGS. 5A and 5B, a first insulating film 106 is formed on a semiconductor substrate 100 including pad electrodes 104 formed thereon. Bit lines 112 including first conductive film patterns 108 and second insulating film patterns 110 are formed on the first insulating film 106.

Then, a silicon oxide based material is deposited on a surface of the resultant structure including the bit lines 112 to form the third insulating film 117. A planarization process like a CMP process or an etch-back process is carried out using the second insulating film patterns 110 as stoppers. That is, the third insulating film 117 is removed until surfaces of the second insulating film patterns 110 are exposed.

Figure 7B:
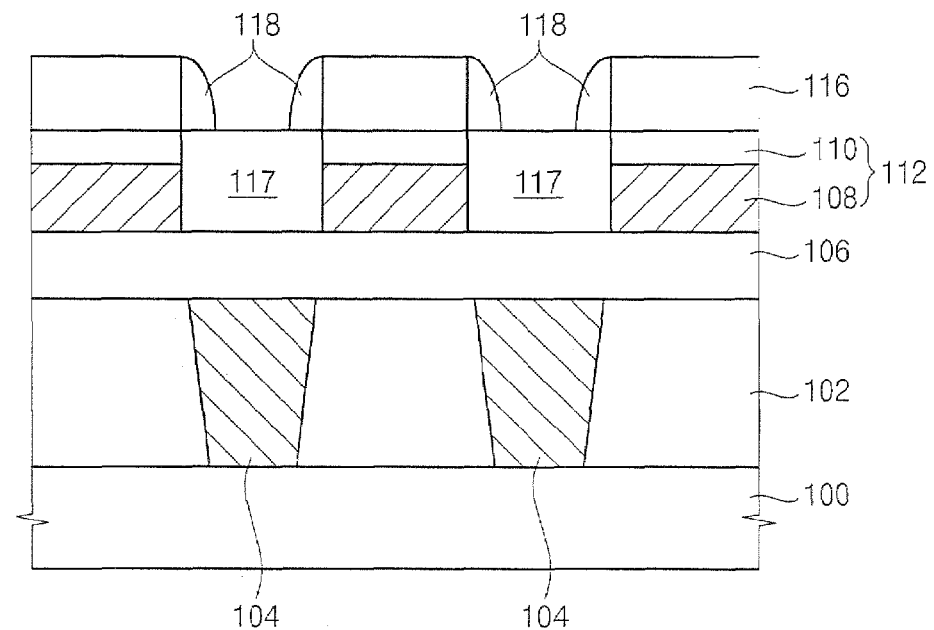

Referring to FIG. 7B, with processes substantially identical to those described in FIGS. 5D to 5F, there are formed contact patterns 116 and contact spacers 118 having high etching selectivities relative to the silicon oxide third insulating film 117. Preferably, the contact pattern 116 is formed using silicon nitride and the contact spacer 118 is formed using polysilicon.

Each contact pattern 116 is formed to have a width wider than that of the bit line 112, and an interval between adjacent contact patterns 116 is determined by a design rule of a storage node contact hole. When the contact pattern 116 is formed using silicon nitride, the contact pattern 116 can be utilized as an interlayer dielectric film for isolating one storage node contact plug successively formed in a subsequent process from other adjacent storage node contact plugs.

Figure 7C:
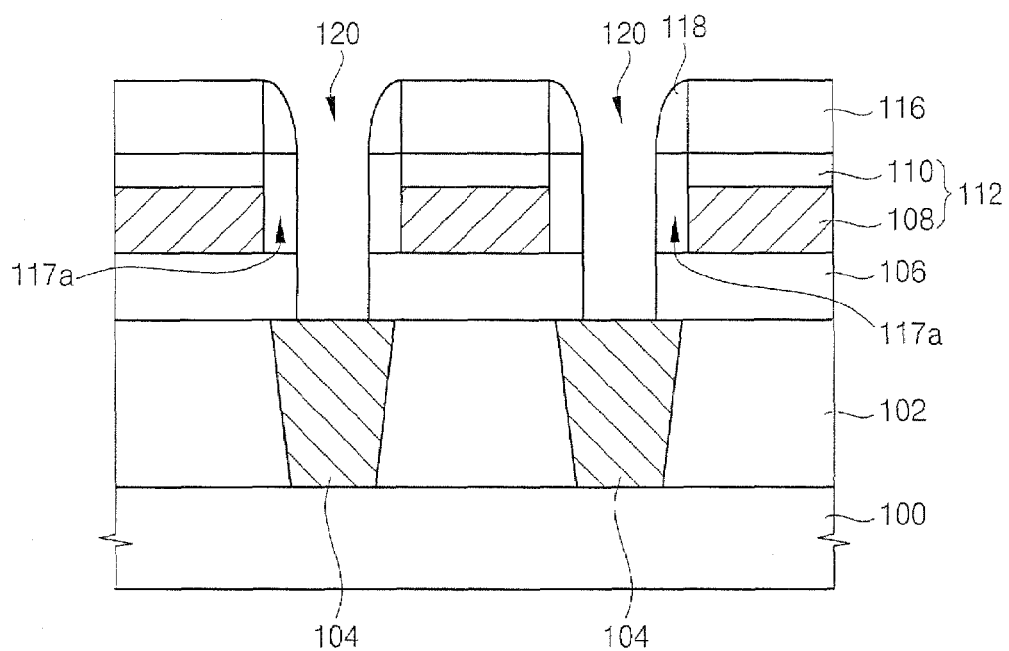

Referring to FIG. 7C, using the contact patterns 116 and the contact spacers 118 as etching masks, the third insulating film 117 and the first insulating film 106 are anisotropically etched to form the storage node contact holes 120 exposing the pad electrodes 104 in the capacitor contact regions corresponding to the source regions between the bit lines 112. At the same time, spacers composed of the third insulating film patterns 117a are formed on the sidewalls of the bit lines 112, respectively.

Figure 7D:
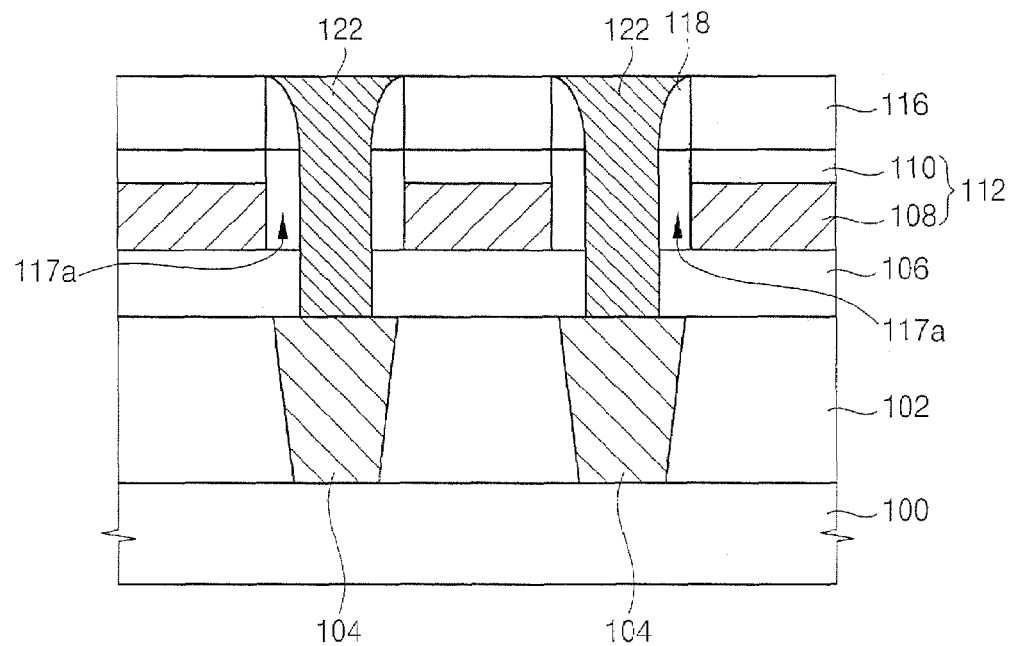

Referring to FIG. 7D, a second conductive film, e.g., a doped polysilicon film, is formed on an surface of the resultant structure including the storage node contact holes 120. The second conductive film is removed by a planarization process such as a CMP process or an etch-back process until surfaces of the contact patterns 116 are exposed. As a result, node-separated storage node contact plugs 122 are formed in the storage node contact holes 120, respectively.

According to the present embodiment, the contact patterns and contact spacers composed of a material having an etching selectivity relative to the silicon oxide based material are formed on wiring such as the bit lines. Then, using the contact patterns and the contact spacers as the etching masks, the insulating films composed of the silicon oxide based material are etched to form the contact holes between adjacent wiring. Since the contact patterns and contact spacers protect the conductive film patterns of the wiring during an etching process for forming the contacts, a thickness of the second insulating film pattern of the wiring can be minimized so that the height of the wiring decreases. Therefore, aspect ratios of the wiring can be reduced while a gap-fill margin between adjacent wiring is improved.

Additionally, since the contact holes between adjacent wiring e.g., the storage node contact holes, are not formed by a self-aligned contact etching process, shoulder margins of the wiring can be maintained to prevent electrical short-circuits between the wiring and the contact plugs formed in the contact holes.

In addition, a parasitic capacitance between adjacent wiring or between the wiring and the contact plug can be reduced because the spacers, which are composed of a silicon oxide based material having a low dielectric constant, are formed on sidewalls of the wiring.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device comprising:
    forming a first insulating film on a semiconductor substrate;
    forming a wiring on the first insulating film wherein the wiring includes conductive film patterns and second insulating film patterns formed on the conductive film patterns;
    forming a third insulating film on the wiring and the first insulating film using a silicon oxide based material;
    planarizing the third insulating film until surfaces of the second insulating film patterns are exposed before forming contact patterns;
    forming the contact patterns on the wiring wherein the contact patterns define contact hole regions;
    forming contact spacers on sidewalls of the contact patterns; and
    etching the third insulating film and the first insulating film using the contact patterns and the contact spacers as masks to form the contact holes and to simultaneously form third insulating film patterns on sidewalls of the wiring.

2. A method of manufacturing a semiconductor device comprising:
    forming a first insulating film on a semiconductor substrate having capacitor contact regions;
    forming bit lines on the first insulating film between the capacitor contact regions wherein the bit lines include first conductive film patterns and second insulating film patterns formed on the first conductive film patterns;
    forming a third insulating film on the bit lines and on the first insulating film wherein the third insulating film includes a silicon oxide based material;
    planarizing the third insulating film until surfaces of the second insulating film patterns are exposed before forming contact patterns;
    forming the contact patterns on the bit lines wherein the contact patterns define storage node contact hole regions;
    forming contact spacers on sidewalls of the contact patterns; and
    etching the third insulating film and the first insulating film using the contact patterns and the contact spacers as masks to form storage node contact holes and to simultaneously form third insulating film patterns on sidewalls of the bit lines.

3. A method of manufacturing a semiconductor device comprising:
    forming a first insulating film on a semiconductor substrate having capacitor contact regions;
    forming bit lines on the first insulating film between the capacitor contact regions wherein the bit lines include first conductive film patterns and second insulating film patterns formed on the first conductive film patterns;
    forming a third insulating film on the bit lines and on the first insulating film wherein the third insulating film includes a silicon oxide based material;
    forming contact patterns on the bit lines wherein the contact patterns define storage node contact hole regions;
    forming contact spacers on sidewalls of the contact patterns;
    forming a second conductive film on the contact patterns, the contact spacers and storage node contact holes wherein the second conductive film fills up the storage node contact holes;

planarizing the second conductive film by a chemical mechanical polishing (CMP) process or an etch-back process when surfaces of the contact pattern are exposed to form storage node contact plugs in the storage node contact holes wherein the storage node contact plugs are connected to the capacitor contact regions; and etching the third insulating film and the first insulating film using the contact patterns and the contact spacers as masks to form the storage node contact holes and to simultaneously form third insulating film patterns on sidewalk of the bit lines.

4. A method of manufacturing a semiconductor device comprising:

forming a first insulating film on a semiconductor substrate having capacitor contact regions;

forming bit lines on the first insulating film between the capacitor contact regions wherein the bit lines include first conductive film patterns and second insulating film patterns formed on the first conductive film patterns;

forming a third insulating film on the bit lines and on the first insulating film wherein the third insulating film includes a silicon oxide based material;

forming contact patterns on the bit lines wherein the contact patterns define storage node contact hole regions;

forming contact spacers on sidewalls of the contact patterns;

forming a second conductive film on the contact patterns, the contact spacers and storage node contact holes wherein the second conductive film fills up the storage node contact holes;

planarizing the second conductive film by a chemical mechanical polishing (CMP) process or an etch-back process until surfaces of the third insulating film patterns formed on the bit lines are exposed to form storage node contact plugs in the storage node contact holes wherein the storage node contact plugs are connected to the capacitor contact regions;

planarizing a predetermined portion of the third insulating film positioned on the bit lines; and etching the third insulating film and the first insulating film using the contact patterns and the contact spacers as masks to form the storage node contact holes and to simultaneously form third insulating film patterns on sidewalls of the bit lines.

5. The method of claim 4, wherein the third insulating film patterns have sufficient thickness to protect the bit lines.

* * * * *